US011035895B2

(12) United States Patent
Ha et al.

(10) Patent No.: US 11,035,895 B2
(45) Date of Patent: Jun. 15, 2021

(54) SIGNAL ACQUISITION APPARATUS AND A METHOD FOR CONTROLLING THE SIGNAL ACQUISITION APPARATUS

(71) Applicant: CONTINENTAL AUTOMOTIVE GMBH, Hannover (DE)

(72) Inventors: Myongsoo Ha, Seoul (KR); Insun Baek, Icheon-si (KR); Jaemin Jung, Yongin-si (KR); Euncheol Seong, Seongnam-si (KR)

(73) Assignee: Vitesco Technologies GmbH, Hannover (DE)

( * ) Notice: Subject to any disclaimer, the term of this patent is extended or adjusted under 35 U.S.C. 154(b) by 124 days.

(21) Appl. No.: 16/096,804

(22) PCT Filed: Apr. 20, 2017

(86) PCT No.: PCT/EP2017/059423
§ 371 (c)(1),
(2) Date: Oct. 26, 2018

(87) PCT Pub. No.: WO2017/186574
PCT Pub. Date: Nov. 2, 2017

(65) Prior Publication Data
US 2019/0271729 A1    Sep. 5, 2019

(30) Foreign Application Priority Data

Apr. 26, 2016 (KR) .......................... 1020160051124

(51) Int. Cl.
*G01R 31/00* (2006.01)
*B60T 8/88* (2006.01)
(Continued)

(52) U.S. Cl.
CPC ............ *G01R 31/006* (2013.01); *B60R 16/03* (2013.01); *B60T 8/885* (2013.01); *F02D 41/222* (2013.01);
(Continued)

(58) Field of Classification Search
CPC ........ H01H 83/20; B60R 16/00; B60R 16/02; B60R 16/023–0232; B60R 16/03;
(Continued)

(56) References Cited

U.S. PATENT DOCUMENTS 3,829,753 A * 8/1974 Marshall ............... H02J 7/1423
320/104
4,719,361 A * 1/1988 Brubaker ................ B60L 50/12
290/45
(Continued)

FOREIGN PATENT DOCUMENTS

EP     0850817 A2    7/1998
EP     2226215 A1    9/2010
(Continued)

*Primary Examiner* — Huy Q Phan
*Assistant Examiner* — David B Frederiksen
(74) *Attorney, Agent, or Firm* — Laurence A. Greenberg; Werner H. Stemer; Ralph E. Locher

(57) ABSTRACT

A signal acquisition apparatus has a vehicle state sensor that outputs measurement results in current form, an overcurrent interrupter connected downstream of the vehicle state sensor, which interrupts an overcurrent due to a short from the output connection of the vehicle state sensor to a battery voltage, and a shunt, connected downstream of the overcurrent interrupter, across which an output voltage corresponding to the output current of the aforementioned overcurrent interrupter is dropped. A control part is provided that controls the operation of the overcurrent interrupter according to
(Continued)

the output voltage dropped across the shunt and assesses the measurement results of the vehicle state sensor on the basis of the output voltage.

6 Claims, 2 Drawing Sheets

(51) Int. Cl.
    *F02D 41/22*        (2006.01)
    *F16H 61/12*        (2010.01)
    *B60R 16/03*        (2006.01)
    *H01H 83/20*        (2006.01)

(52) U.S. Cl.
    CPC ............ *F16H 61/12* (2013.01); *H01H 83/20* (2013.01); *B60T 2270/414* (2013.01); *F16H 2061/1284* (2013.01); *H01H 2083/203* (2013.01); *Y02T 10/40* (2013.01)

(58) Field of Classification Search
    CPC ........ F02D 41/22; F02D 41/222; F16H 61/12; G01R 31/005; G01R 31/006; G01R 31/007
    See application file for complete search history.

(56) References Cited

U.S. PATENT DOCUMENTS

| | | |
|---|---|---|
| 4,791,809 A | 12/1988 | Schmidt |
| 5,986,359 A * | 11/1999 | Enderich ............. H02H 7/0844 307/125 |
| 6,807,035 B1 * | 10/2004 | Baldwin ................ H02H 3/335 361/42 |
| 8,154,837 B2 | 4/2012 | Trapp et al. |
| 2004/0084018 A1 * | 5/2004 | Zhu ....................... F01N 3/2006 123/406.14 |
| 2004/0084034 A1 * | 5/2004 | Huberts .................. F02P 3/045 123/630 |
| 2008/0218002 A1 | 9/2008 | Straka |
| 2009/0040666 A1 * | 2/2009 | Elms .................... H02H 1/0015 361/42 |
| 2010/0182725 A1 * | 7/2010 | Trapp ..................... B60T 8/885 361/93.1 |
| 2011/0199709 A1 | 8/2011 | Ieda |
| 2014/0211345 A1 * | 7/2014 | Thompson ........... H02H 1/0061 361/42 |
| 2015/0244165 A1 * | 8/2015 | Roesner ................ H02J 7/0026 361/79 |
| 2015/0346758 A1 | 12/2015 | Sakakibara |

FOREIGN PATENT DOCUMENTS

| | | | |
|---|---|---|---|
| EP | 2637182 A1 | 9/2013 | |
| GB | 2020496 A | 11/1979 | |
| GB | 2344386 A * | 6/2000 | ............. F16H 61/12 |
| KR | 1998054057 A | 9/1998 | |
| KR | 1020050018441 A | 2/2005 | |
| KR | 1020060081245 A | 7/2006 | |
| KR | 1020070108737 A | 11/2007 | |
| KR | 1020150120037 A | 10/2015 | |
| WO | 8605235 A1 | 9/1986 | |
| WO | 2007017523 A1 | 2/2007 | |

* cited by examiner

SIGNAL ACQUISITION APPARATUS AND A METHOD FOR CONTROLLING THE SIGNAL ACQUISITION APPARATUS

BACKGROUND OF THE INVENTION

Field of the Invention

Vehicles are generally provided with electronic control systems in order to improve vehicle safety.

Such electronic control systems include the anti-lock braking system (ABS), which prevents the brakes from locking because of skidding on slippery driving surfaces and makes it possible for the driver to steer when braking, the traction control system (TCS), which prevents the vehicle from skidding when starting the vehicle on slippery driving surfaces or when accelerating rapidly on starting, the electronic stability program (ESP, also referred to as the ESC), which controls the stability of the vehicle response, etc.

Such an electronic control system is provided with a plurality of sensors which monitor the vehicle state and the operating state; the plurality of sensors transmit monitoring data which are taken as a basis for achieving control.

However, in the event of a short from an output of one of these sensors to the battery resulting in an overcurrent, there arises the problem that, as a consequence of the overcurrent being interrupted by an overcurrent interrupter provided for that purpose, the precise nature of the fault cannot be assessed.

With regard to this earlier technology, there exists the Korean patent no. 1998-0054057 (Sep. 25, 1998) "Electronic control unit for overcurrent protection in motor vehicles".

SUMMARY OF THE INVENTION

The present invention was developed to address problems such as those mentioned above, and as such the object of the present invention is to provide a signal acquisition apparatus and a method for controlling the signal acquisition apparatus, capable of accurately assessing a fault state even in the presence of an overcurrent interrupter.

According to one aspect of the present invention, a signal acquisition apparatus is formed by a vehicle state sensor that outputs measurement results in current form, an overcurrent interrupter connected downstream of the vehicle state sensor, which interrupts an overcurrent due to a short from the output connection of the vehicle state sensor to a battery voltage, a shunt, connected downstream of the overcurrent interrupter, across which an output voltage corresponding to the output current of the aforementioned overcurrent interrupter is dropped, and a control part that controls the operation of the overcurrent interrupter according to the output voltage dropped across the shunt and assesses the measurement results of the vehicle state sensor on the basis of the output voltage.

In a refinement of the invention, the signal acquisition apparatus is further formed by an analog-to-digital converter that converts the output voltage of the shunt into digital values.

In a development of the invention, provision is also made for a filter that is connected to the input of the analog-to-digital converter and removes noise from the output voltage.

In a further development of the invention, the control part is characterized in that it periodically outputs a disable signal and thus limits the operation of the overcurrent interrupter according to the output voltage across the overcurrent interrupter.

According to the other aspect of the present invention, a method is designed for controlling a signal acquisition apparatus as described above with a first phase in which the control part outputs an enable signal to the overcurrent interrupter, which interrupts an overcurrent due to a short to battery voltage, and receives the output voltage across the shunt caused by the output current of the vehicle state sensor, a second phase in which the control part compares the output voltage with a first set voltage, a third phase in which the control part, after comparing the output voltage with the first set voltage, outputs a disable signal to the overcurrent interrupter if the output voltage is below the first set voltage, and an assessment phase in which the control part assesses a state of the signal acquisition apparatus according to the output voltage.

In a refinement of the method according to the invention, the third phase, in which a disable signal is output to the overcurrent interrupter, is characterized in that the disable signal is output periodically.

In an advantageous development of the present invention, the method for controlling a signal acquisition apparatus is characterized in that the assessment phase, in which the state of the signal acquisition apparatus is assessed, is a seventh phase in which the control part assesses the output voltage representing the measurement result of the vehicle state sensor to be normal if the output voltage exceeds the first set voltage, is a fifth phase in which the control part assesses the situation to be a short to the battery voltage if, after output of the aforementioned disable signal to the overcurrent interrupter, the output voltage is above a second set value, and is a sixth phase in which the control part assesses the situation to be a line fault or a ground fault if the output voltage is below the aforementioned second set value.

BRIEF DESCRIPTION OF THE SEVERAL VIEWS OF THE DRAWING

The invention is intended to be described in more detail below with reference to exemplary embodiments with the aid of figures. In the drawing.

DESCRIPTION OF THE INVENTION

A signal acquisition apparatus and a control method according to the present invention will be explained below with reference to the figures. It should be noted that the thickness of the lines or the size of the structural elements, etc. may be exaggerated in the figures for the sake of clarity and facilitating the explanation. Additionally, since the following terms have been defined in consideration of the functions of the present invention, they may vary depending on the intent of or use by the user or operator. Consequently, these terms should be interpreted on the basis of the complete content of the present specification.

Figure 1:
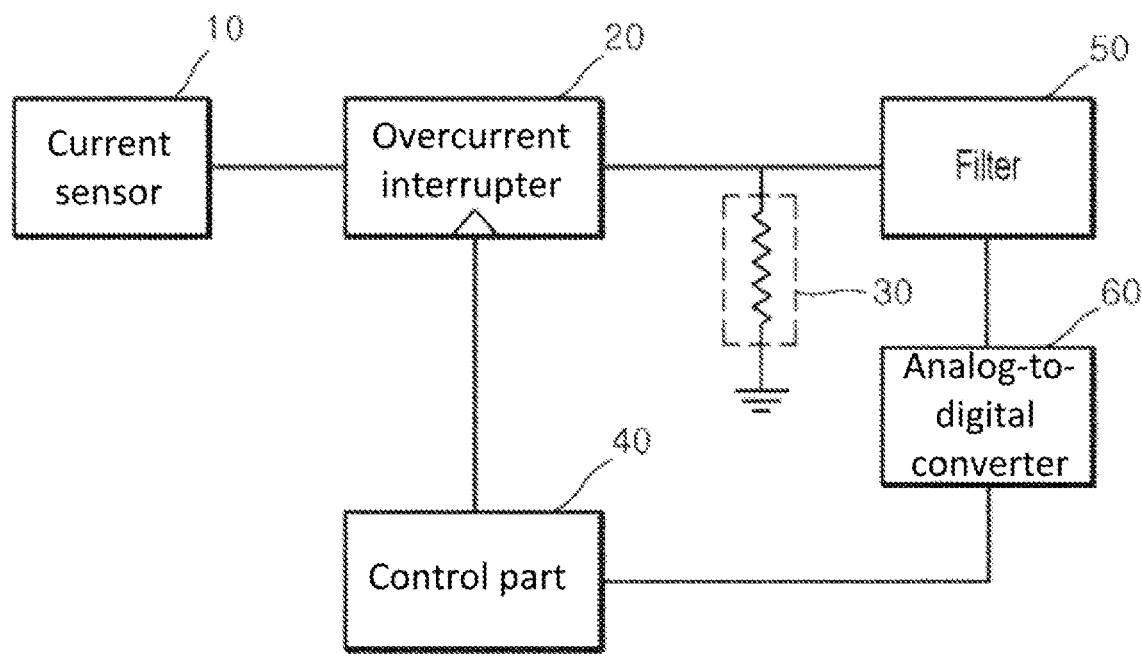
FIG. 1 shows a block diagram representing a signal acquisition apparatus according to an exemplary embodiment of the present invention.

As shown in FIG. 1, a current sensor according to one exemplary embodiment of the present invention comprises a vehicle state sensor 10, an overcurrent interrupter 20, a shunt 30 and a control part 40, as well as a filter 50 and an analog-to-digital converter 60.

The vehicle state sensor 10, as the sensor that outputs the measurement results of the vehicle state in current form, may comprise various sensors so as to monitor the vehicle state with an electronic control system (not shown). The current signal delivered by the vehicle state sensor 10 is transformed into an output voltage by a shunt 30, which output voltage is picked up by the analog-to-digital converter 60, optionally after smoothing by the filter 50. The shunt 30 could be damaged or destroyed by an overcurrent resulting from a short to the battery voltage.

An overcurrent interrupter 20 is therefore provided, which interrupter detects an overcurrent and breaks the connection to the shunt. The overcurrent interrupter 20 therefore interrupts an overcurrent at the output of the vehicle state sensor 10 caused by a short to the vehicle battery.

An output voltage corresponding to the output current of the overcurrent interrupter 20 is dropped across the shunt 30.

That is to say that the output current output by the vehicle state sensor 10 flows through the shunt 30 after it has passed through the overcurrent interrupter 20. Consequently, the output voltage arises across the shunt 30.

The control part 40 controls the operation of the overcurrent interrupter 20 according to the output voltage produced across the shunt 30 and assesses the measurement results on the basis of the output voltage.

In order to assess the measurement results on the basis of the output voltage, the control part 40 periodically outputs a disable signal according to the output voltage across the overcurrent interrupter 20 and thus limits the operation of the overcurrent interrupter 20.

That is to say that in the event of the output voltage being below the first set voltage, e.g. having a value of 0 V, the state is such that no output current flows at the shunt 30, which can be assessed as a state in which there is no output from the overcurrent interrupter 20.

However, it is not possible to assess whether the state in which there is no output from the overcurrent interrupter 20 is a state in which there is no output because an overcurrent has been received and has been interrupted, or whether it is a state in which a line fault or a ground fault has occurred at the input of the overcurrent interrupter 20 and hence the output current of the vehicle state sensor 10 has not been received.

Consequently, in the event of the output voltage being below the first set voltage, the control part 40 compares the output voltage that has been input with the second set voltage after having periodically output a disable signal to the overcurrent interrupter 20 for a short time, and it assesses whether the fault state is due to a short to the battery or due to a line fault or a ground fault.

That is to say that when the control part 40 outputs a disable signal to the overcurrent interrupter 20, the input overcurrent is not interrupted by the overcurrent interrupter 20 and flows through the shunt 30, since the operation of the overcurrent interrupter 20 has been limited. If the overcurrent flows to the shunt 30 in this way there is a risk that the shunt 30 will be damaged, so the disable signal is output periodically only for a short time, and while the operation of the overcurrent interrupter 20 is limited, it is assessed whether the output current has been interrupted.

The resulting output voltage across the shunt 30 is higher than the output voltage arising from the normal output current of the vehicle state sensor 10, since it has resulted from the battery current due to a short to the battery and from the output current of the vehicle state sensor 10.

Consequently, the control part 40 can assess the situation to be a fault state due to a short to the battery if the output voltage exceeds the second set voltage. However, it can be assessed as a fault state due to a line fault between the vehicle state sensor 10 and the overcurrent interrupter 20 or due to a ground fault if the output current does not flow even though the operation of the overcurrent interrupter 20 is limited.

Furthermore, the control part 40 for the output voltage assesses the measurement result of the vehicle state sensor 10 to be normal if the output voltage exceeds the first set voltage.

The analog-to-digital converter 60 can convert the output voltage of the shunt 30 into digital values and input the output voltage into the control part 40 as digital values.

The filter 50 removes noise arising on the shunt 30 from the output voltage, thereby allowing the precise output voltage for the measurement results to be input.

As mentioned above, for a signal acquisition apparatus according to an exemplary embodiment of the present invention, the output current of the vehicle state sensor 10 is optionally input, making it possible for the fault state to be accurately assessed, even if the input current is interrupted by the overcurrent interrupter 20.

Figure 2:
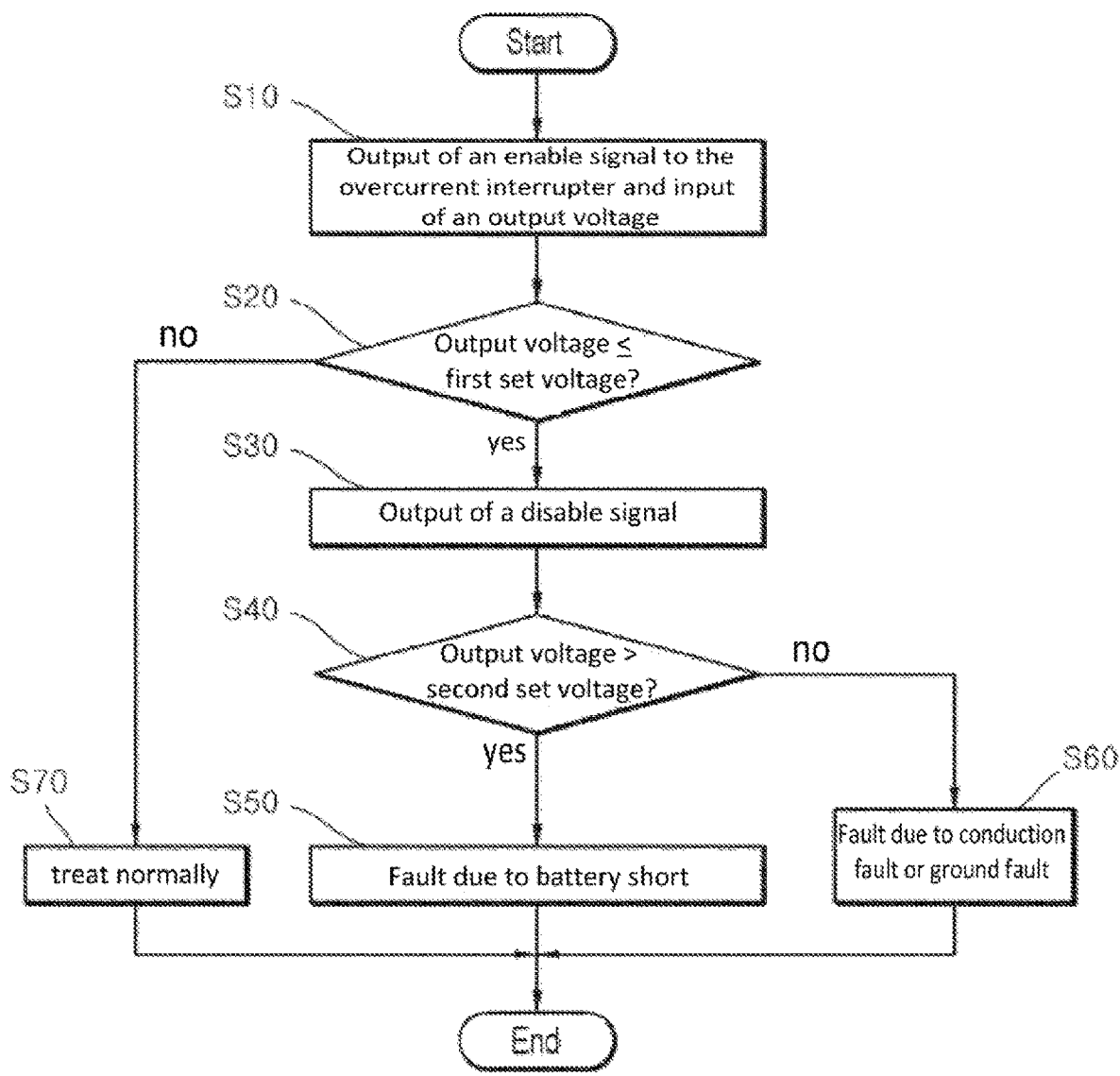
FIG. 2 shows a flow diagram for explaining the method for controlling a signal acquisition apparatus according to an exemplary embodiment of the present invention.

FIG. 2 is a flow diagram for explaining a method for controlling a signal acquisition apparatus according to an exemplary embodiment of the present invention.

As shown in FIG. 2, the control part 40 first delivers, in a first phase S10, an enable signal to the overcurrent interrupter 20, which interrupts an overcurrent, and receives the output voltage resulting from the output current of the vehicle state sensor 10.

That is to say that the control part 40 can interrupt the overcurrent input by the vehicle state sensor 10 and protect the circuit downstream of the overcurrent interrupter 20 by delivering an enable signal to the overcurrent interrupter 20 in the usual manner and ensuring that the overcurrent interrupter 20 is operated as usual.

After it has received the output voltage in the first phase S10, the control part 40 compares the output voltage with a first set voltage in a second phase S20.

If the output voltage exceeds the first set voltage in the second phase S20, the control part 40 treats, in a seventh phase S70, the output voltage arising from the measurement result of the vehicle state sensor 10 as normal.

However, if, in the second phase S20, the output voltage is below the first set voltage, the control part 40 delivers, in a third phase S30, a disable signal to the overcurrent interrupter 20.

As an example of the output voltage being below the first set voltage, e.g. having a value of 0 V, the state is such that no output current flows at the shunt 30, which can be assessed as a state in which there is no output from the overcurrent interrupter 20.

However, it is not possible to assess whether the state in which there is no output from the overcurrent interrupter 20 is a state in which there is no output because an overcurrent has been received and has been interrupted, or whether it is a state in which a line fault or a ground fault has occurred at the input of the overcurrent interrupter 20 and hence the output current of the vehicle state sensor 10 has not been received.

Consequently, when the control part 40 outputs a disable signal to the overcurrent interrupter 20, the input overcurrent is not interrupted by the overcurrent interrupter 20 and flows through the shunt 30, since the operation of the overcurrent interrupter 20 has been limited.

If the overcurrent flows to the shunt 30 in this instance there is a risk that the shunt 30 will be damaged, and while the operation of the overcurrent interrupter 20 is limited by virtue of a disable signal being periodically output for a short time only, it is assessed whether the output current has been interrupted.

After a disable signal has been output to the overcurrent interrupter 20 in this way in the third phase S30 and the operation of the overcurrent interrupter 20 has been limited thereby, the control part 40 compares, in a fourth phase S40, the output voltage with a second set voltage.

If, in the fourth phase S40, the output voltage exceeds the second set value, the control part 40 assesses this in a fifth phase S50 to be a fault state due to a short from the output of the vehicle state sensor 10 to the battery.

That is to say that the resulting output voltage across the shunt 30 is higher than the output voltage arising from the normal output current of the vehicle state sensor 10, since it results from the battery current due to a short to battery voltage and from the output current of the vehicle state sensor 10.

Consequently, the control part 40 can assess the situation to be a fault state due to a short to the battery if the output voltage exceeds the second set voltage.

However, if, in the fourth phase S40, the output voltage is below the second set value, i.e. if the output current does not flow even though the operation of the overcurrent interrupter 20 has been limited, the control part 40 assesses this in a sixth phase S60 to be a fault state due to a line fault between the vehicle state sensor 10 and the overcurrent interrupter 20 or a ground fault.

As mentioned above, for a method for controlling a signal acquisition apparatus according to an exemplary embodiment of the present invention, the output current of the vehicle state sensor 10 is optionally input, making it possible for the fault state to be accurately assessed, even if the input current is interrupted by the overcurrent interrupter 20.

Although the present invention has been explained with reference to an exemplary embodiment represented in the figures, this is provided merely by way of indication; a person skilled in the art will understand that various modifications thereto and other, similar exemplary embodiments thereof are possible.

The invention claimed is:

1. A signal acquisition apparatus, comprising:
   a vehicle state sensor outputting measurement results in current form and having an output connection, wherein at least two fault states can effect operation of said vehicle state sensor;
   an overcurrent interrupter connected downstream of said vehicle state sensor, said overcurrent interrupter configured for interrupting an overcurrent due to each one of the at least two fault states effecting operation of said vehicle state sensor;
   a shunt connected downstream of said overcurrent interrupter, an output voltage corresponding to an output current of said overcurrent interrupter being dropped across said shunt; and
   a control part controlling an operation of said overcurrent interrupter according to the output voltage dropped across said shunt and assessing the measurement results of said vehicle state sensor on a basis of the output voltage;
   said control part configured for periodically disabling said overcurrent interrupter while said control part assesses the measurement results to enable said control part to distinguish one of the at least two fault states effecting operation of said vehicle state sensor from another one of the at least two fault states effecting operation of said vehicle state sensor.

2. The signal acquisition apparatus according to claim 1, further comprising an analog-to-digital converter that converts and outputs the output voltage of said shunt as digital values, said analog-to-digital converter having an input.

3. The signal acquisition apparatus according to claim 2, further comprising a filter connected to said input of said analog-to-digital converter and filters out interference in the output voltage.

4. The signal acquisition apparatus according to claim 1, wherein said control part is configured to output a disable signal and to limit an operation of said overcurrent interrupter if the output voltage across said overcurrent interrupter is lower than or equal to a first set voltage.

5. A method for controlling a signal acquisition apparatus, which comprises the steps of:
   outputting, in a first phase via a control part, an enable signal to an overcurrent interrupter, the enable signal interrupting an overcurrent due to each of at least two fault states effecting operation of a vehicle state sensor;
   receiving, in the control part, an output voltage across a shunt caused by an output current of a vehicle state sensor;
   comparing, in a second phase via the control part, the output voltage with a first set voltage;
   periodically outputting, in a third phase via the control part, after the comparing of the output voltage with the first set voltage, a disable signal to the overcurrent interrupter if the output voltage is below the first set voltage; and
   while the overcurrent interrupter is periodically disabled by the disable current, performing an assessment phase in which the control part assesses a state of the signal acquisition apparatus according to the output voltage to thereby distinguish one of the at least two fault states effecting operation of the vehicle state sensor from another one of the at least two fault states effecting operation of the vehicle state sensor.

6. The method for controlling the signal acquisition apparatus according to claim 5, wherein the assessment phase, in which the state of the signal acquisition apparatus is assessed is:
   a seventh phase in which the control part assesses the output voltage representing the measurement result of the vehicle state sensor to be normal if the output voltage exceeds the first set voltage;
   a fifth phase in which the control part assesses a situation to be a short to the battery voltage if, after an output of the disable signal to the overcurrent interrupter, the output voltage is above a second set value; and
   a sixth phase in which the control part assesses it to be a line fault or a ground fault if the output voltage is below the second set value.

\* \* \* \* \*